(12) United States Patent
Jak et al.

(10) Patent No.: US 9,195,144 B2
(45) Date of Patent: Nov. 24, 2015

(54) SPECTRAL PURITY FILTER, RADIATION SOURCE, LITHOGRAPHIC APPARATUS, AND DEVICE MANUFACTURING METHOD

(75) Inventors: Martin Jacobus Johan Jak, Eindhoven (NL); Vadim Yevgenyevich Banine, Deurne (NL); Maarten Marinus Johannes Wilhelmus Van Herpen, Heesch (NL); Wouter Anthon Soer, Nijmegen (NL); Andrei Mikhailovich Yakunin, Eindhoven (RU)

(73) Assignee: ASML Netherlands B.V., Veldhoven (NL)

(*) Notice: Subject to any disclaimer, the term of this patent is extended or adjusted under 35 U.S.C. 154(b) by 1117 days.

(21) Appl. No.: 13/059,057

(22) PCT Filed: Jul. 9, 2009

(86) PCT No.: PCT/EP2009/004981
§ 371 (c)(1),
(2), (4) Date: Apr. 28, 2011

(87) PCT Pub. No.: WO2010/003671
PCT Pub. Date: Jan. 14, 2010

(65) Prior Publication Data
US 2011/0211185 A1   Sep. 1, 2011

Related U.S. Application Data

(60) Provisional application No. 61/079,975, filed on Jul. 11, 2008, provisional application No. 61/136,150, filed on Aug. 14, 2008, provisional application No. 61/136,983, filed on Oct. 20, 2008.

(51) Int. Cl.
*G03B 27/72* (2006.01)
*G03F 7/20* (2006.01)
*G21K 1/10* (2006.01)

(52) U.S. Cl.
CPC ............ *G03F 7/702* (2013.01); *G03F 7/70191* (2013.01); *G03F 7/70575* (2013.01); *G21K 1/10* (2013.01)

(58) Field of Classification Search
CPC . G03F 7/70191; G03F 7/70575; G03F 7/702; G03F 7/70033; G03F 7/70941
USPC ....................................... 355/71, 67
See application file for complete search history.

(56) References Cited

U.S. PATENT DOCUMENTS 6,014,251 A   1/2000  Rosenberg et al.
6,522,465 B1  2/2003  Goldstein
(Continued)

FOREIGN PATENT DOCUMENTS

EP   1 515 188 A1   3/2005
EP   1 708 031 A2   10/2006
(Continued)

OTHER PUBLICATIONS

Notice of Allowance mailed Nov. 9, 2012 for U.S. Appl. No. 12/500,198, filed Jul. 9, 2009; 9 pages.
(Continued)

*Primary Examiner* — Peter B Kim
(74) *Attorney, Agent, or Firm* — Sterne, Kessler, Goldstein & Fox, P.L.L.C.

(57) ABSTRACT

A spectral purity filter is configured to allow transmission therethrough of extreme ultraviolet (EUV) radiation and to refract or reflect non-EUV secondary radiation. The spectral purity filter may be part of a source module and/or a lithographic apparatus.

17 Claims, 11 Drawing Sheets

(56) References Cited

U.S. PATENT DOCUMENTS

| | | | |
|---|---|---|---|
| 6,737,662 | B2 | 5/2004 | Mulder et al. |
| 6,906,787 | B2 | 6/2005 | Van De Kerhof et al. |
| 7,154,666 | B2 | 12/2006 | Wedowski |
| 7,372,623 | B2 | 5/2008 | Banine et al. |
| 7,453,645 | B2 | 11/2008 | Klunder et al. |
| 8,139,200 | B2 | 3/2012 | Van Herpen et al. |
| 9,041,912 | B2 * | 5/2015 | Soer et al. .................. 355/71 |
| 2002/0186741 | A1 | 12/2002 | Kleinschmidt et al. |
| 2004/0114120 | A1 | 6/2004 | Van De Kerhof et al. |
| 2006/0146413 | A1 | 7/2006 | Klunder et al. |
| 2006/0221440 | A1 | 10/2006 | Banine et al. |
| 2006/0245058 | A1 | 11/2006 | Van Herpen et al. |
| 2007/0170379 | A1 | 7/2007 | Watson et al. |
| 2008/0239268 | A1 | 10/2008 | Mulder et al. |
| 2010/0020304 | A1 | 1/2010 | Soer et al. |
| 2011/0143269 | A1 * | 6/2011 | Yakunin et al. .................. 430/5 |
| 2011/0157573 | A1 * | 6/2011 | Soer et al. .................. 355/67 |
| 2013/0010363 | A1 | 1/2013 | Soer et al. |

FOREIGN PATENT DOCUMENTS

| | | |
|---|---|---|
| JP | 05-217857 A | 8/1993 |
| JP | 08-236425 A | 9/1996 |
| JP | 2000-352612 A | 12/2000 |
| JP | 2004-186691 A | 7/2004 |
| JP | 2004-524524 A | 8/2004 |
| JP | 2004-317693 A | 11/2004 |
| JP | 2006-191090 A | 7/2006 |
| JP | 2006-279036 A | 10/2006 |
| JP | 2006-310793 A | 11/2006 |
| WO | WO 2009/061192 A1 | 5/2009 |

OTHER PUBLICATIONS

Notice of Allowance mailed Sep. 18, 2012 for U.S. Appl. No. 12/500,198, filed Jul. 9, 2009; 7 pages.

U.S. Appl. No. 13/617,705, Soer et al., "Spectral Purity Filters for Use in a Lithographic Apparatus," filed Sep. 14, 2012.

International Search Report directed to related International Patent Application No. PCT/EP2009/004981, mailed Dec. 17, 2009, from the European Patent Office; 4 pages.

International Preliminary Report on Patentability and the Written Opinion of the International Searching Authority directed to related International Patent Application No. PCT/EP2009/004981, mailed Jan. 11, 2011, from the International Bureau of WIPO; 7 pages.

English-Language Translation of Notice of Reasons for Rejection directed to related Japanese Patent Application No. 2009-162313, mailed Jun. 27, 2011, from the Japanese Patent Office; 3 pages.

Non-Final Rejection mailed Jan. 17, 2012 for U.S. Appl. No. 12/500,198, filed Jul. 9, 2009; 7 pages.

Final Rejection mailed Jul. 6, 2012 for U.S. Appl. No. 12/500,198, filed Jul. 9, 2009; 6 pages.

International Search Report directed to related International Patent Application No. PCT/EP2009/005488, mailed Dec. 23, 2009.

European Office Action directed to related European Patent Application No. 09 777 515.9, mailed Jan. 8, 2013.

Singapore Written Opinion and Search Report directed to related Singaporean Patent Application No. 201100299-5, mailed Apr. 19, 2013.

Bibishkin, M.S., et al.. "Multilayer Zr/Si filters for EUV lithography and for radiation source metrology," Proc. of SPIE, Micro- and Nanoelectronics 2007, vol. 7025, Oct. 1, 2007; pp. 702502-1 to 702502-10.

Johnson, T.A., et al., "Zirconium and niobium transmission data at wavelengths from 11-16 nm and 200-1200 nm," Proc. of SPIE, Optical Constants of Materials for UV to X-Ray Wavelengths, vol. 5538, 2004; pp. 119-124.

Kaye & Laby, "Optical pyrometry," The Tables of Physical and Chemical Constants, Section 2.3.4, 16th Edition, 1995, National Physical Laboratory; 3 pages.

Louis, E., et al., "Multilayer optics with spectral purity layers for the EUV wavelength range," Proc. of SPIE, Emerging Lithographic Technologies X, vol. 6151, Jan. 1, 2006; pp. 615139-1 to 615139-5.

Powell, F.R., et al., "Filter windows for EUV lithography," Proc. of SPIE, Emerging Lithographic Technologies V, vol. 4343, 2001, pp. 585-589.

Ravindra, N.M., et al., "Modeling and Simulation of Emissivity of Silicon-Related Materials and Structures," Journal of Electronic Materials, vol. 32, No. 10, 2003; pp. 1052-1058.

Truong, V.V., et al., "Optical properties of bulk niobium from 6.6 to 23 eV," Journal of the Optical Society of America, vol. 68, No. 8, Aug. 1978; pp. 1017-1018.

Non-Final Rejection mailed Oct. 3, 2014 for U.S. Appl. No. 13/617,705, filed Sep. 14, 2012; 12 pages.

Notice of Allowance mailed Jan. 30, 2015 for U.S. Appl. No. 13/617,705, filed Sep. 14, 2012; 7 pages.

Non-Final Rejection mailed Nov. 15, 2012 for U.S. Appl. No. 13/058,783, filed Feb. 11, 2011; 9 pages.

Final Rejection mailed Feb. 12, 2013 for U.S. Appl. No. 13/058,783, filed Feb. 11, 2011; 9 pages.

Non-Final Rejection mailed Aug. 20, 2013 for U.S. Appl. No. 13/058,783, filed Feb. 11, 2011; 10 pages.

Final Rejection mailed Oct. 29, 2013 for U.S. Appl. No. 13/058,783, filed Feb. 11, 2011; 10 pages.

* cited by examiner

SPECTRAL PURITY FILTER, RADIATION SOURCE, LITHOGRAPHIC APPARATUS, AND DEVICE MANUFACTURING METHOD

CROSS-REFERENCE TO RELATED APPLICATIONS

This application claims the benefit of U.S. provisional application 61/136,150, which was filed on 14 Aug. 2008, and which is incorporated herein in its entirety by reference.

This application claims the benefit of U.S. provisional application 61/136,983, which was filed on 20 Oct. 2008, and which is incorporated herein in its entirety by reference.

This application claims the benefit of U.S. provisional application 61/079,975, which was filed on 11 Jul. 2008, and which is incorporated herein in its entirety by reference.

FIELD

The present invention relates to a spectral purity filter, a radiation source for an extreme ultraviolet (EUV) radiation lithographic apparatus, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to be able to project ever smaller structures onto substrates, it has been proposed to use EUV radiation which is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm.

Radiation may be produced using plasma. The plasma may be created, for example, by directing a laser at particles of a suitable material (e.g. tin), or by directing a laser at a stream of a suitable gas or vapor, such as Xe gas or Li vapor. The resulting plasma emits output radiation, e.g., EUV radiation, which is collected using a collector such as a mirrored incidence collector, which receives the radiation and focuses the radiation into a beam. Such a radiation source is typically termed a laser produced plasma (LPP) source.

In addition to radiation, the plasma of a plasma radiation source produces contamination in the form of particles, such as thermalized atoms, ions, nanoclusters, and/or microparticles. The contamination is output, together with the desired radiation, from the radiation source towards the collector and may cause damage to the incidence collector and/or other parts.

A radiation source may also output secondary radiation in addition to the desired radiation. For example, a EUV plasma radiation source may output secondary radiation having a wavelength selected from the range of 20-400 nm in addition to desired EUV radiation, most notably in the deep ultraviolet range (100-400 nm). Moreover, the secondary radiation may include EUV radiation as if a certain wavelength or range of wavelengths of EUV radiation is desired and other EUV radiation is in the output radiation that is not that certain wavelength of desired EUV radiation or in range of wavelengths of desired EUV radiation. Such secondary radiation may arise in a LPP radiation source due to the laser used to generate the plasma, the laser radiation having a wavelength longer than EUV radiation (often 10.6 µm wavelength radiation from a $CO_2$ laser).

In lithography, it is desirable to improve spectral purity, i.e., to remove secondary radiation from the output beam to yield a higher proportion of desired radiation. For example, resist is sensitive to a wavelength of the secondary radiation, and thus the image quality may be deteriorated. Since the optics of a EUV lithographic apparatus has a high reflectivity (for example, for 10.6 µm wavelength secondary radiation from a LPP source), the secondary radiation may reach the substrate with significant power. Additionally or alternatively, the secondary radiation, particularly the laser radiation in a LPP radiation source, may lead to undesired heating of the patterning device, substrate, and/or optics.

Accordingly, it is desirable to provide, for example, a spectral purity filter for use in or with a radiation source, wherein secondary radiation may be removed completely or partially and/or contamination mitigation is effectively improved.

SUMMARY

According to an aspect of the invention, there is provided a spectral purity filter configured to allow transmission therethrough of extreme ultraviolet (EUV) radiation and to refract or reflect non-EUV secondary radiation.

In an embodiment, at least one aperture is defined in material of the spectral purity filter, the aperture having a cross-dimension larger than the wavelength of the EUV radiation but smaller than the non-EUV secondary radiation. The at least one aperture may improve transmission of the EUV radiation, but substantially does not change the optical properties of the material for the non-EUV secondary radiation.

In an embodiment, the material is transmissive of the non-EUV secondary radiation. This may be advantageous in that the non-EUV secondary radiation does not heat the material.

In an embodiment of the spectral purity filter, the material is formed as an optically active body that provides for a transition in the effective refractive index for the non-EUV secondary radiation, the at least one aperture extends in a first direction and the transition has a main transition direction in a direction that deviates from the first direction. As the transition in the effective refractive index for the non-EUV secondary radiation has a main transition direction in a direction that deviates from the first direction, the secondary non-EUV radiation is deflected from a direction of the EUV radiation, which is mainly determined by the first direction of the at least one aperture.

According to an aspect of the invention, there is provided a source module for use in or with a lithographic apparatus, the source module being constructed to generate extreme ultraviolet (EUV) radiation and to output the EUV radiation and non-EUV secondary radiation, the source module comprising a spectral purity filter as described above.

An embodiment of the source module is constructed to converge the generated radiation to an intermediate focus, the spectral purity filter being arranged in a location of the optical path wherein the spectral purity filter receives the generated radiation and before the intermediate focus, and wherein the at least one aperture of the spectral purity filter is aligned in a direction of propagation of the converging generated radiation. Herein the at least one aperture in the spectral purity filter cooperates with the facility that generates the converging radiation to achieve an optimal throughput of the EUV radiation.

According to an aspect of the invention, there is provided a lithographic apparatus arranged to project a pattern from a patterning device onto a substrate, comprising a spectral purity filter as described above and/or a source module as described above.

According to an aspect of the invention, there is provided a device manufacturing method comprising projecting a patterned beam of extreme ultraviolet (EUV) radiation onto a substrate, wherein the EUV radiation is filtered by a spectral purity filter as described above, generated by a source module as described above, or projected by a lithographic apparatus as described above.

According to an aspect of the invention, there is provided a device manufacturing method comprising generating radiation comprising extreme ultraviolet (EUV) radiation and non-EUV secondary radiation using a radiation source, filtering the radiation to allow transmission of EUV radiation and to refract or reflect non-EUV secondary radiation, and projecting a patterned beam of the transmitted EUV radiation onto a substrate.

According to an aspect of the invention, there is provided a lithographic apparatus that includes a source module configured to generate extreme ultraviolet (EUV) radiation and to output the EUV radiation and non-EUV secondary radiation, a spectral purity filter configured to allow transmission therethrough of the EUV radiation and to refract or reflect the non-EUV secondary radiation, and a projection system configured to project a pattern beam of radiation comprising the EUV radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
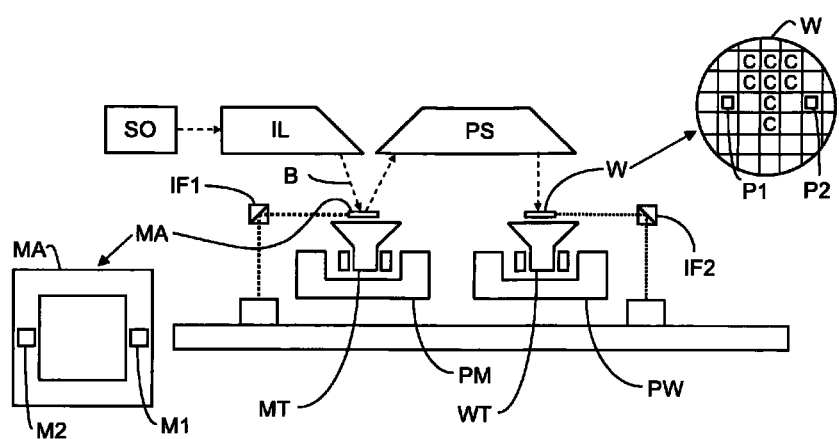
FIG. 1 schematically depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is a $CO_2$ laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
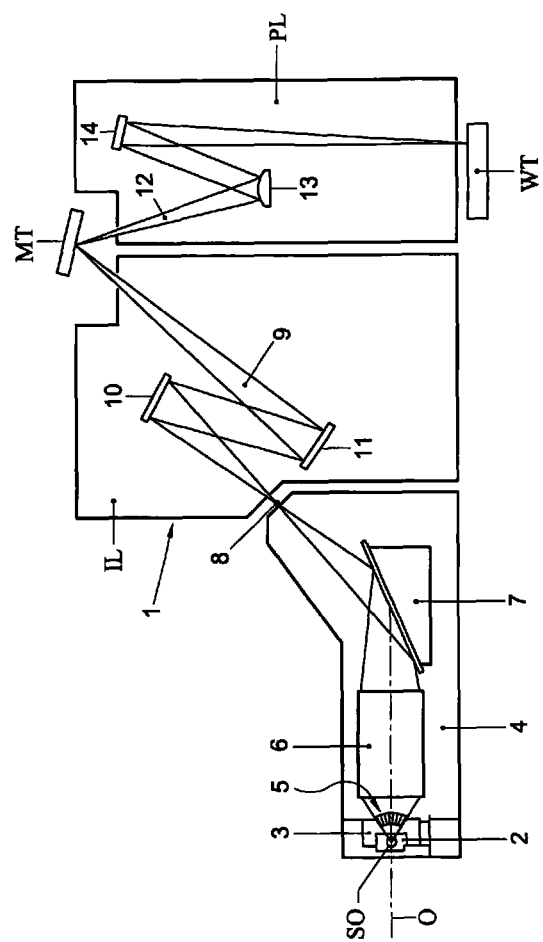
FIG. 2 depicts a detailed schematic illustration of a lithographic apparatus according to an embodiment of the invention.

FIG. 2 shows the apparatus 1 in more detail, including a radiation source SO, an illumination optics unit IL, and a projection system PL. The radiation source SO includes a radiation emitter 2 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4.

In an embodiment, the radiation source SO includes the source chamber 3 and collector chamber 4.

The collector chamber 4 includes a contamination trap 5 and grazing incidence collector 6 (shown schematically as a rectangle). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a patterning device (e.g., a mask) positioned on support structure MT. A patterned beam 12 is formed which is imaged in projection system PL via first and second reflective elements 13, 14 onto a substrate (not shown) held on a substrate table WT. More elements than shown may generally be present in illumination optics unit IL and projection system PL. In embodiments in which the source module SO includes a laser produced plasma (LPP) source, the collector may be suitably located a normal incidence collector rather than the grazing incidence collector 6 depicted in FIG. 2.

Figure 3:
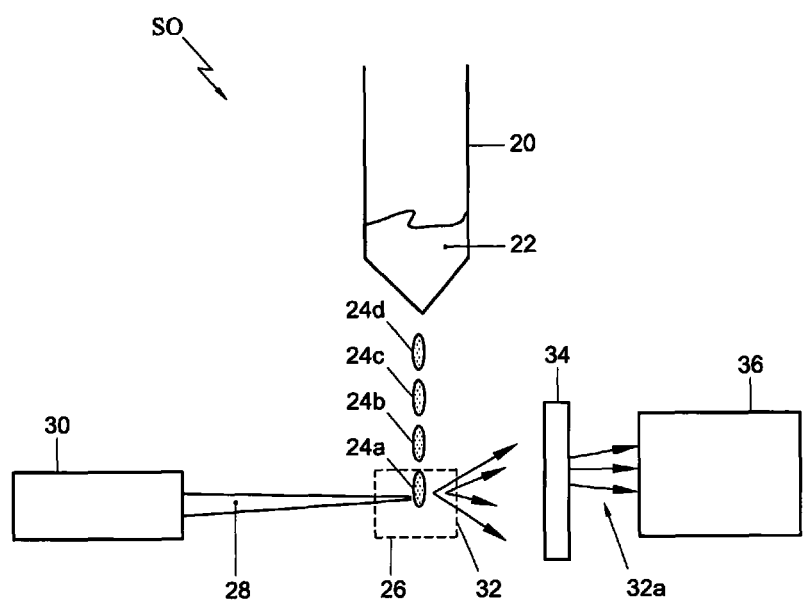
FIG. 3 schematically depicts a radiation source according to an embodiment of the invention.

FIG. 3 schematically depicts a radiation source according to an embodiment of the invention. The radiation source module SO may comprise a container 20 arranged with a liquefied target material 22, for example with Sn or Gd. The container 20 may be arranged with a suitable mechanism or opening (not shown) for delivery of liquid droplets 24a, 24b, 24c, 24d of Sn or Gd to the region 26 wherein a droplet is configured to be impinged by a laser beam 28 provided by a laser 30. The laser beam 28 may relate to a $CO_2$ laser having a wavelength of 10.6 micrometer. Alternatively, other suitable lasers may be used having respective wavelengths in the range of 1-11 micrometers. The laser beam is desirably focused in the region 26 using a suitable optical system (not shown). Upon interaction with the laser beam the droplets 24a, 24b, 24c, 24d are transferred into plasma state which may emit a 6.7 nm radiation, or any other EUV radiation in the range of 5-20 nanometers.

The emanating EUV beam 32 may be intercepted by a suitable debris mitigation system 34, such as contamination trap 5, configured to collect or to deflect particle debris emanating from the region 26. The EUV beam 32a substantially free of debris may then enter a subsequent optical system 36 of the radiation source or of the lithographic apparatus, such as illumination system IL of the lithographic apparatus configured to suitably condition the beam 32a. The radiation source SO may include a buffer gas for cooperating with a source of laser produced plasma. The buffer gas may have at least 50% transmission for the EUV radiation, and at least 70% absorption for the secondary radiation. Desirably, the buffer gas has at least 90% or at least 95% transmission for the EUV radiation. It is further desirable that the buffer gas has at least 90% absorption for the secondary radiation.

To improve spectral purity, a spectral purity filter for use in or with an EUV source may be used. A problem is how to create a spectral purity filter with a high suppression of secondary radiation (e.g., by a factor 10 or higher) and a high transmittance for EUV radiation, since nearly all materials absorb EUV radiation. Additionally or alternatively, if the spectral purity filter is based on the principle of absorption of the secondary radiation, a problem arises as to how to reduce the heat load on the spectral purity filter.

A transmissive spectral purity filter may be used wherein the EUV radiation is transmitted and the secondary radiation (e.g., 10.6 μm wavelength radiation) is deflected or absorbed. For example, a spectral purity filter may be provided that transmits both the EUV and secondary radiation, and changes the direction of the secondary radiation by diffraction through a phase grating. The secondary radiation can then be blocked by a body having an aperture therein, the EUV radiation passing through the aperture, to avoid thermal problems with the spectral purity filter. However, it may be difficult to obtain very high diffraction efficiency with such a phase grating as it involves very precise tuning of the geometry to the wavelength. It may also only be effective for a very narrow range of wavelengths and angles of incidence.

As another example, a structured metal film having a plurality of apertures may be used. The radiation transmission will be small if the apertures are significantly smaller than a wavelength of the radiation. If they are much larger than a wavelength of the radiation, then the transmission will be proportional to the open area. Apertures of, for example, 1 to 5 μm cross-dimension (e.g., diameter) are small enough to block 10.6 μm radiation, while being large enough to transmit EUV radiation. Instead of a two-dimensional structure with apertures, a one-dimensional wire-grid may be used. Such a grid deflects only one of the polarizations of the radiation, but by using two of them in sequence in a crossed configuration both polarizations of radiation can be deflected. However, in order to have sufficient EUV radiation transmission, the structure needs to be very open, and the walls between the apertures (or the wires of the wire-grid) need to be very narrow. When the metal parts are too narrow, the 10.6 μm radiation will not be effectively suppressed anymore, and the structure may be very fragile and susceptible to heating problems.

A reflective spectral purity filter may be used that combines a EUV radiation reflective top layer with an anti-reflective (AR) coating for the secondary radiation (e.g., 10.6 μm wavelength radiation). However it is difficult to find a material combination that simultaneously reflects EUV radiation efficiently and transmits or absorbs secondary radiation effectively at a sufficiently large range of angles.

According to an embodiment of the invention, there is provided a spectral purity filter for use in or with a EUV source that is based on using refraction to deflect secondary radiation out of the output radiation to yield a higher proportion of desired EUV radiation in output radiation. The spectral purity filter comprises an optically active body of a medium transmissive for the secondary radiation, and comprises at least one aperture in a first direction having a cross-diameter transverse to said direction larger than the wavelength of the EUV-radiation and less than the wavelength of the secondary radiation. The optically active body provides for a transition in the effective refractive index for the secondary radiation. The transition has a main transition direction in a direction that deviates from the first direction. The transition in refractive index may be present at a change of the medium, for example the interface between the medium of the optically active body and the medium (e.g. vacuum or air) of the environment wherein it is arranged. In that case the main transition direction is equal to the normal of the surface forming the interface between the medium of the optically active body and the medium of the environment. In an embodiment, a transition in refractive index may be intrinsic to the medium used by the optically active element. In that case, the direction having the highest change in refractive index is considered the main transition direction.

The at least one aperture has a cross-diameter larger than the wavelength of the EUV radiation, so as to obtain sufficient EUV transmission. The cross-diameter of the aperture is however smaller than the wavelength of the non-EUV secondary radiation so that the propagation of the secondary radiation is substantially controlled by the spectral purity filter as if these apertures were not present.

Figure 4:
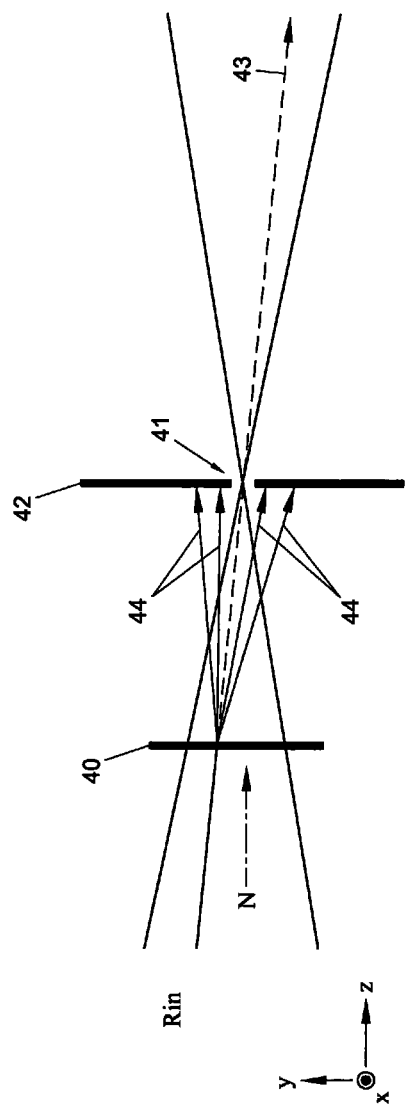
FIG. 4 schematically depicts a spectral purity filter with a radiation blocking body according to an embodiment of the invention.
Figure 12A:
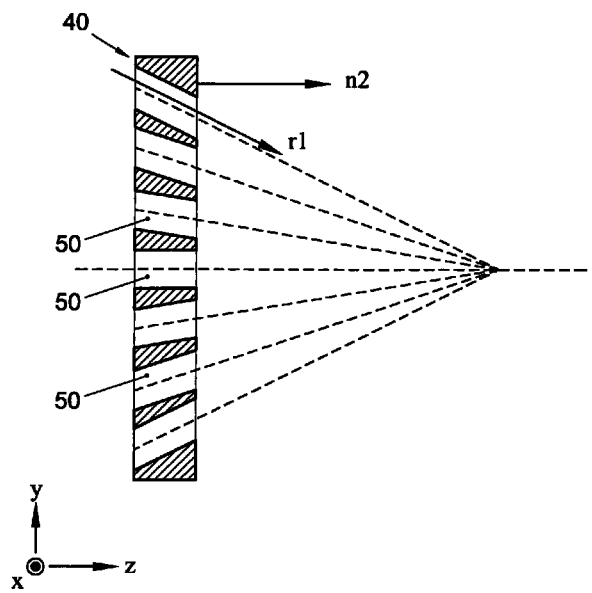
FIG. 12 schematically illustrates options to align an aperture of the spectral purity filter with the incoming radiation.
Figure 12B:
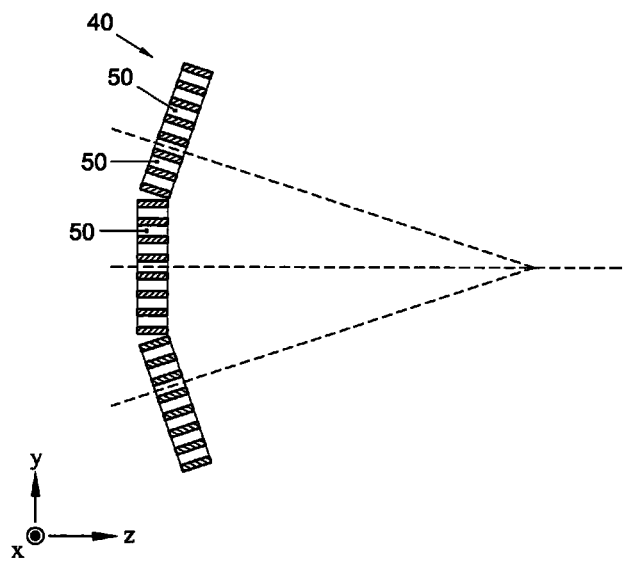

FIG. 4 is a schematic illustration of a spectral purity filter 40 according to an embodiment of the invention that redirects the secondary radiation 44 in an output direction deviating from the desired EUV radiation 43. In FIG. 4 an x,y,z coordinate system is shown wherein the direction z indicates the main optical path, i.e. the global propagation direction of the radiation. Embodiments of the spectral purity filter will hereinafter be shown with reference to this coordinate system. The spectral purity filter comprises an optically active body 40 of a medium transmissive for the secondary radiation, and comprises at least one aperture (50, see FIG. 5A, 5B) in a first direction having a cross-diameter transverse to said direction larger than the wavelength of the EUV-radiation and smaller than the wavelength of the secondary radiation. In the embodiment shown the spectral purity filter 40 is part of a source module that is constructed to converge generated radiation Rin to an intermediate focus. The spectral purity filter 40 is arranged in a location of the optical path wherein it receives the generated radiation Rin and before the intermediate focus. In the embodiment shown the at least one aperture 50 has a direction parallel with an optical axis of the spectral filter. In another embodiment, as illustrated by FIG. 12A, 12B for example the at least one aperture 50 of the spectral purity filter 40 is aligned in a direction of propagation of the converging generated radiation.

A body 42 having a pin-hole 41 at the intermediate focus allows transmission of the EUV radiation 43 through the pin-hole, but blocks the redirected radiation 44.

According to an embodiment of the invention, the spectral purity filter 40 is a transmissive filter that redirects the secondary radiation. However, instead of using diffraction due to a phase grating, the spectral purity filter 40 comprises a structure having at least one surface to refract secondary radiation away from the propagation direction of the output radiation, the surface having a relief, for example, an array of lenslets, prisms, or surface roughness. EUV radiation transmission is achieved by having one or more apertures, e.g., perforating the spectral purity filter with many small apertures, with a cross-dimension (e.g. diameter) larger than the wavelength of the desired EUV radiation but smaller than that of the rejected secondary radiation.

In order to use refraction, a medium with a sufficiently high refractive index should be used. At the same time, absorption of the medium should be low for both EUV radiation and the secondary radiation in order to maintain EUV radiation flux and limit the heat load. Since there are no known materials with a sufficiently low absorption for EUV radiation, this is practically impossible.

In an embodiment of the invention, a material that is transparent for non-EUV secondary radiation (e.g. infrared) is used, the material have one or more apertures. The aperture can transmit EUV radiation. As long as the aperture has a cross-dimension that is substantially smaller than the wavelength of this secondary radiation, the secondary radiation will experience a homogeneous effective medium with a refractive index between that of the material and vacuum (effective medium approximation). In this way, a new medium is created that is both transparent for non-EUV secondary radiation and EUV radiation. Its refractive index for this secondary radiation can be tuned by varying the total area of the aperture in the material (mainly the porosity factor).

Figure 5A:
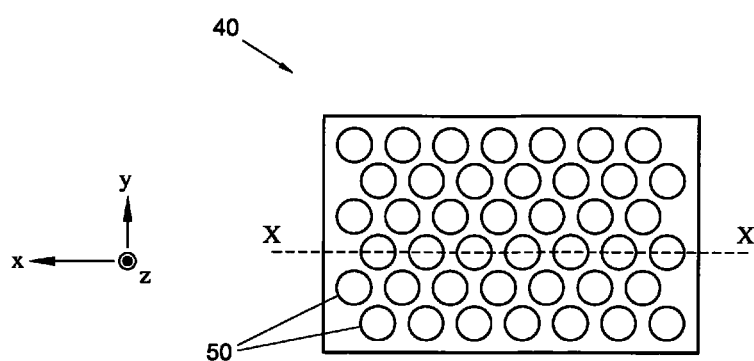
FIG. 5A schematically depicts a top view of the spectral purity filter according to N in FIG. 4.
Figure 5B:
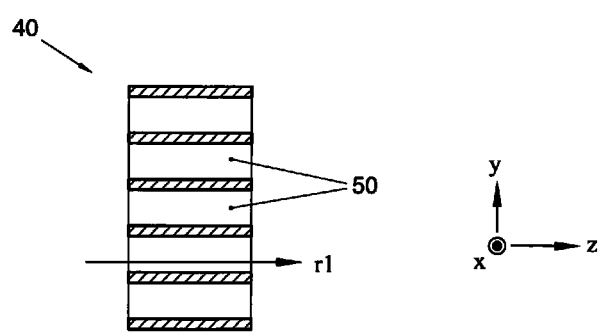
FIG. 5B shows a cross-section according to X-X in FIG. 5A.

FIGS. 5A and 5B schematic illustrate a spectral purity filter 40 including a block of material that is made substantially transparent for EUV radiation by having a large number of apertures 50. FIG. 5A shows a top view according to N in FIG. 4, while FIG. 5B shows the cross-section through X-X. The apertures 50 have a first direction r1. For clarity, the spectral purity filter 40 is illustrated as a plate of material. However, in practice the spectral purity filter 40 may have a surface relief as shown in FIGS. 7 to 10B. In this way, an optically active body may be formed that provides for a transition in the effective refractive index for the non-EUV secondary radiation in a direction that deviates from the first direction r1 of the apertures. In an embodiment, this may be realized without a global surface relief as illustrated by the embodiment of FIGS. 11A and 11B.

The spectral purity filter according to an embodiment has a relatively good transmission for the desired EUV radiation in the first direction as the at least one aperture has a cross-diameter greater than the wavelength of the desired EUV-radiation. The at least one aperture is substantially invisible to the secondary radiation, having a wavelength longer than the EUV-radiation, so that the propagation of the non-EUV radiation is mainly determined by the details of the shape of the optically active body at a scale larger than the at least one aperture. As the optically active body has a transition in refractive index in a direction deviating from the first direction r1, the secondary radiation will be deflected, or even reflected so that it the secondary radiation propagates in an other direction than the desired EUV radiation, and can be separated therefrom.

As a simple effective medium approximation, the dielectric constant of the 'new' material can be calculated as a linear combination of the dielectric constant of the original material and the dielectric constant of the aperture (vacuum):

$$\epsilon \approx f \epsilon_{vacuum} + (1-f) \epsilon_{medium} \qquad (1)$$

From this the effect on the refractive index n can be calculated since $$n \approx \sqrt{\epsilon} \qquad (2)$$

So:

$$n^2 \approx p + (1-p) n_{medium}^2 \qquad (3)$$

Therefore, the higher the porosity factor p of the aperture (and hence the higher the EUV radiation transmission), the lower the effective refractive index will be. The porosity factor p is considered the portion of the original medium that is absent through the presence of apertures. The porosity factor p may vary throughout the medium, as will be illustrated in a further embodiment. At 10.6 μm wavelength, silicon has a refractive index of 3.74-i0.001. Therefore a layer of silicon with an aperture having a porosity factor of 90% should have an effective refractive index of n≈1.52. This value is very similar to the refractive index of many glasses in the visible wavelength range. Therefore, even with such an open structure it should be possible to use refraction to alter the radiation path. Silicon may be particularly suitable since it is possible to create densely packed micrometer-sized apertures by anisotropic etching. However, in general all materials that are substantially transparent to the secondary radiation may be used, for example, in the case of 10.6 μm radiation, ZnSe, ZnS, GaAs, Ge, etc.

In FIGS. 5A and 5B, cylindrical apertures 50 with a circular cross-section are shown. However, other shapes may be used. For example, with square apertures, or hexagonal apertures to form a honeycomb structure, a closer packing, and hence a higher porosity factor may be achieved.

Figure 6A:
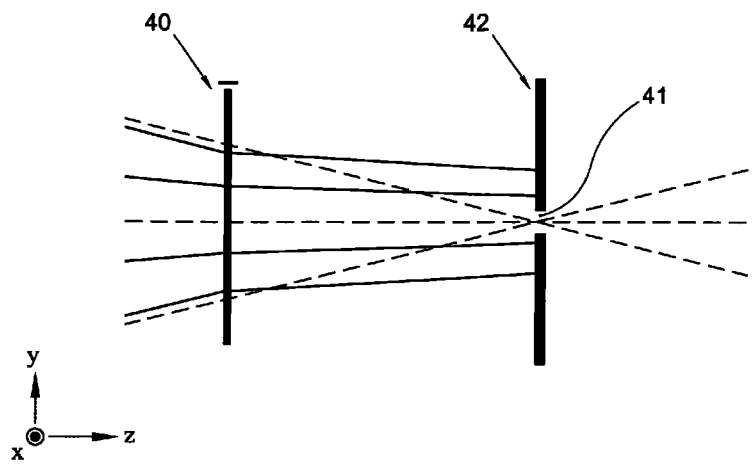
FIG. 6A schematically depicts a negative lens.
Figure 6B:
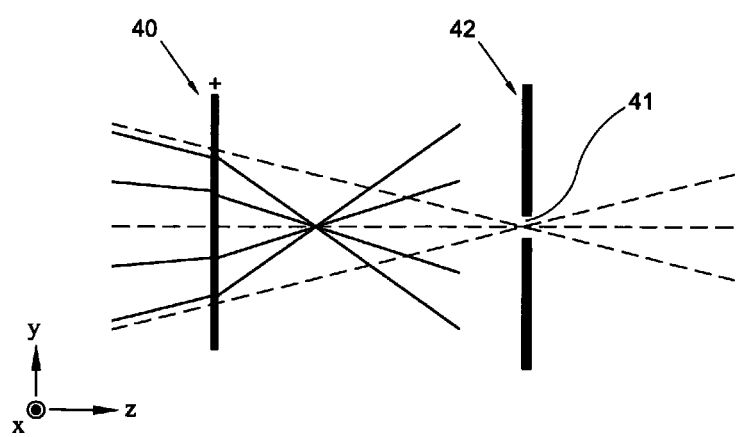
FIG. 6B schematically depicts a positive lens, in front of an intermediate focus, that can redirect secondary radiation away from the focus.
Figure 7:
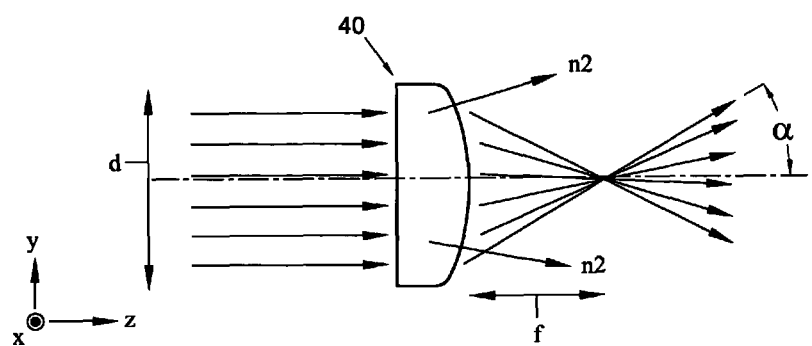
FIG. 7 schematically depicts the angular spread created by a lens.

In order for the spectral purity filter 40 to redirect secondary radiation away from the intermediate focus, any of several structures can be used. The redirection as shown in FIG. 4 can be achieved, for example, with a negative lens or a positive lens of the spectral purity filter 40. FIG. 6A schematically depicts a negative lens and FIG. 6B schematically depicts a positive lens, in front of the intermediate focus, that can redirect the secondary radiation away from the focus of the desired radiation so that it can be blocked by body 42 having an aperture 41 at the location of the focus of the desired radiation. In an embodiment, the block of material of the spectral purity filter 40 is shaped as the positive or negative lens. In the embodiment of FIGS. 6A, 6B and 7, the transition in the effective refractive index is determined by the interface between the material of the optically active body and the environment (e.g. air). Accordingly, the main direction of this transition is the normal of the entrance or exit surface of the optically active body. As can be seen in FIG. 7, the direction of the normal of the exit surface deviates generally from the direction of the z-axis. The direction of the apertures (not shown for clarity) coincides with the z-axis in this case. Accordingly the main direction of the transition n1, n2 deviates from the direction of the apertures.

If the spectral purity filter 40 is made as a single lens, it may be rather thick. This leads to a very high aspect ratio for the EUV transmitting aperture, and hence only a very narrow transmission cone. Indeed, referring to FIG. 7, the angular spread created by a lens (starting from a parallel beam) is given by the f-number, which is the ratio of focal length f and diameter d. The lower this number, the larger the angle α. The focal length f depends on the refractive index and the lens shape (radius of curvature R), as can be described with the equation: f=R/(n−1). An f-number of 4 (f=4d) will give an angular spread α of ±7°. With an effective refractive index of 1.5, this implies that f=2R, so R=2d.

Thus, the minimum thickness t of such a lens is $$t = R - \sqrt{R^2 - \left(\frac{d}{2}\right)^2}, \quad (4)$$

So t=0.064*d

This shows that a single lens with a large diameter of ~10 cm should be more than 0.5 cm thick. This may be problematic for EUV radiation transmission. For an array of lenses, however, the structure can be much thinner. With a pitch of 150 microns, a thickness of 10 microns will be sufficient. This should be thin enough to be able to make the EUV radiation transmitting aperture, and obtain sufficient EUV radiation transmission. For example, the aperture cross-dimension may be 2 microns. This results in a transmission cone α for the EUV radiation of a tan(2/10)=11 degrees. At the same time, the pitch of the lenses is more than an order of magnitude larger than the wavelength of the undesired radiation. This is desirable to avoid diffraction, which may concentrate the power in just a few directions.

Figure 8A:
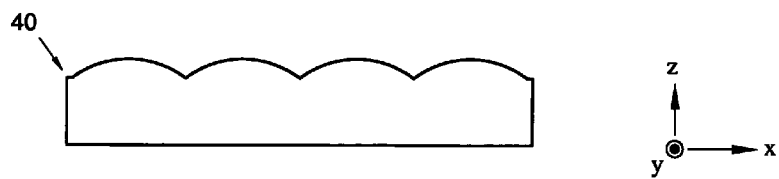
FIG. 8A schematically depicts a cross-section of an ordinary lens array.
Figure 8B:
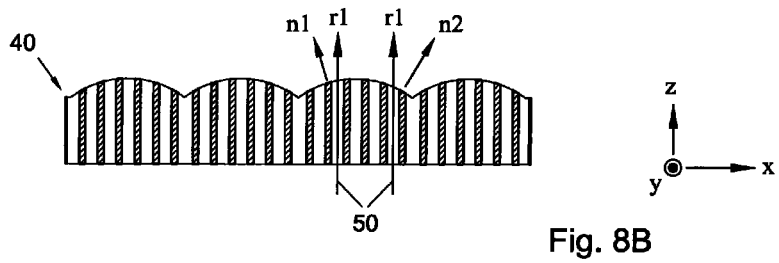
FIG. 8B schematically depicts the lens array perforated with a plurality of apertures to form a spectral purity filter.

Therefore, in an embodiment, an array of lenses is used as shown in FIGS. 8A and 8B. This can be an one-dimensional lenticular array, or a two-dimensional grid of lenses. In an embodiment, the spectral purity filter 40 may essentially be a microlens array spectral purity filter. FIG. 8A is a schematic cross-section of an ordinary lens array, and FIG. 8B is a schematic cross-section of the lens array perforated with a plurality of apertures to form the spectral purity filter 40. The transition direction of the refractive index n1, n2 is determined here by the curvature of the interface between the medium of the optically active body 40 and the surrounding medium. As shown in FIG. 8B, for at least one aperture 50 it holds that a main transition direction of the refractive index n1, n2 for the secondary radiation differs from the direction r1 of the at least one aperture.

Accordingly, the EUV-radiation will pass relatively unhindered by the apertures, while the undesired radiation having a wavelength longer than a cross-diameter of the apertures will be refracted so that a spatial separation occurs between the EUV-radiation and the secondary radiation. Subsequently the undesired secondary radiation may be intercepted.

Figure 9A:
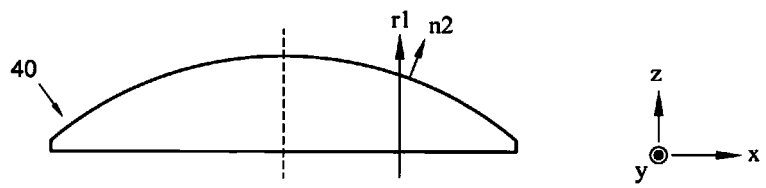
FIG. 9A schematically depicts a traditional convex lens.
Figure 9B:
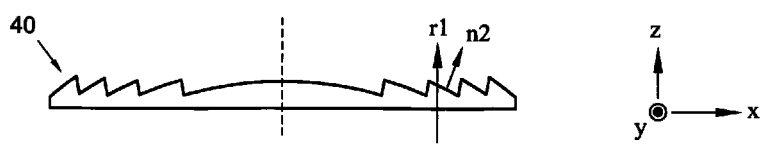
FIG. 9B schematically depicts a Fresnel lens.
Figure 10A:
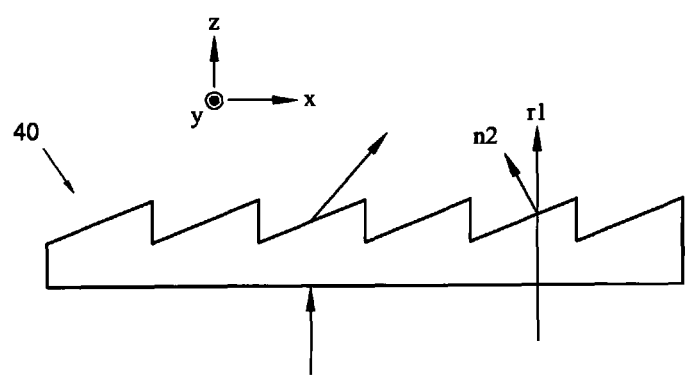
FIG. 10A schematically depicts deflection of radiation with prism and pyramid structures.

FIG. 9B shows how alternatively a Fresnel lens 40 may be used to achieve a reduced thickness t as compared to that of a traditional convex lens as shown in FIG. 9A. Likewise, a traditional concave lens may be replaced by a Fresnel lens. For clarity FIG. 9A, 9B do not show the apertures. Also in this case it holds for at least one aperture (not shown) a main transition direction of the refractive index for the secondary radiation differs from the direction r1 of the at least one aperture.

Alternatively or additionally to using a lens, another structure may be used to deflect radiation. For example, referring to FIG. 10A (wherein the one or more EUV radiation transmitting apertures are omitted for clarity), one or more prisms or pyramids may be used. As shown in FIG. 10A the exit surface has tilted faces having a surface normal n2 that deviates from the direction r1 into which the apertures extend. Accordingly a main transition direction of the refractive index for the secondary radiation differs from the direction r1 of the apertures.

Figure 10B:
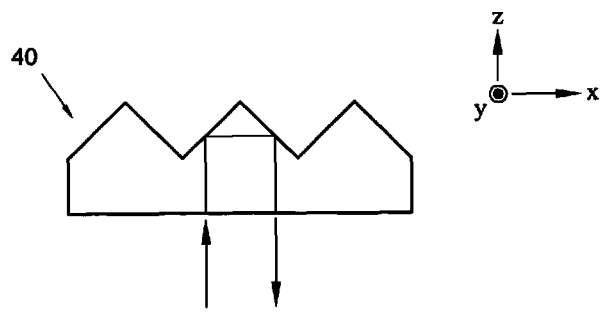
FIG. 10B schematically depicts reflection of radiation with prism and pyramid structures.
Figures 11A, 11B:
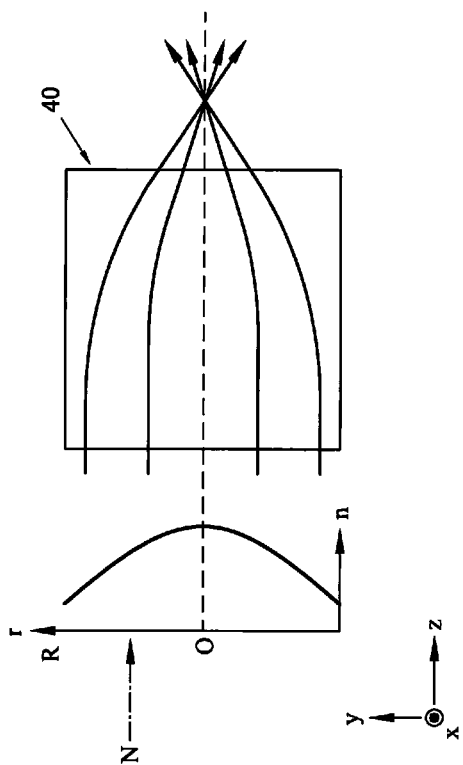
FIG. 11A schematically depicts a cross-section through an optical axis of the lens.
FIG. 11B schematically depicts an example of a varying aperture pattern to create a gradient in the effective refractive index; shown according to N in FIG. 11A.

The structure may even be used to reflect instead of deflect radiation as shown in FIG. 10B. Alternatively or additionally to these well defined structures, surface roughness can be used to scatter the radiation out of the beam. In this case, there should be a substantial roughness component with a length scale of the order of the secondary radiation wavelength (or larger).

In an embodiment, a surface structure is not used to create, for example, the lenses or prisms. Rather, the refractive index can be changed to deflect rays in the same way as an ordinary lens. Changing the effective refractive index can be used to create a graded refractive index (GRIN) lens. FIG. 11A schematically depicts an operating principle of a GRIN lens, showing rays bending towards the region with highest refractive index shown by the darkest shading. As shown in the graph on the left hand side of FIG. 11A, in this embodiment the refractive index decreases in a direction away from the center.

In the embodiment shown in FIGS. 11A and 11B, the gradient in refractive index is achieved by slowly varying the aperture pattern (e.g., size and/or density of apertures) in the material of the spectral purity filter 40. The refractive index decreases in a radial direction from a radius r=0 to radius r=R as the porosity, i.e. the fraction of the medium replaced by apertures gradually increases in said direction. FIG. 11B schematically depicts this example of a varying aperture pattern to create a gradient in the effective refractive index. FIG. 11B shows a portion of the lens 40 according to view N in FIG. 11A. A potential advantage of this embodiment is that the lens may be made thinner (resulting in a lower aspect ratio and hence better EUV radiation transmission), because no thickness variation is needed to create the lens. In this embodiment, the presence of the apertures has a dual function in that their presence contributes to the transmissivity of the optically active body for the desired EUV-radiation, and in that their distribution causes the desired gradient in refractive index. In the embodiment of FIG. 11A, 11B, a positive lens is formed. In an embodiment, a negative lens may be formed by providing for a radially decreasing porosity, and therewith a radially increasing refractive index. The embodiment shown in FIG. 11A, 11B, wherein the lens is a positive lens is desired however, as the relatively highly porous part is in the circumference of the lens, so that the lens has a relatively high transmissivity for the EUV radiation in comparison to a negative GRIN lens. In these embodiments, the main transition direction is transverse to an optical axis of the lens, while the apertures have a direction along the optical axis. Accordingly, the lens according to this embodiment will pass the EUV radiation in a parallel impingent beam substantially unchanged, while the propagation of the undesired radiation is changed into a divergent or convergent beam.

This concept may be combined with one or more of the structures described above to ease the specifications on the thickness of the spectral purity filter (e.g. to make a stronger lens without increasing the lens thickness).

In an embodiment, a GRIN lens is created by varying the refractive index of the material itself. This may be achieved, for example, by doping the material locally.

In most embodiments discussed above, it is may be desirable for the pitch of a plurality of apertures to be large enough to avoid diffraction. If the periodic structure of apertures has pitch on the order of the wavelength, the scattered radiation will not be distributed over a large range of angles, but will be diffracted into a few well-defined, confined directions. Usually the zero order diffraction peak is one of the stronger peaks. This peak however is not deflected, and therefore this may be undesirable.

However, it is also possible to use diffraction. For example, if the prism structure shown in the top of FIG. 10A is made with a prism angle and a periodicity such that the angle of deflection due to refraction at the prism coincides with the angle of a diffraction order, then a very high diffraction efficiency in this specific direction may be obtained. This is basically a blazed grating.

In FIGS. 8A, 8B and 9A, 9B, and 10A, 10B, surface variance is shown on the radiation exit side of the spectral purity filter 40. Additionally or alternatively, surface corrugation may be present at the radiation entrance side of the spectral purity filter 40. Furthermore, one or more sides of the spectral purity filter may be metal coated to create additional reflection of the secondary radiation.

In an embodiment, the rays of radiation incident on the filter may be parallel. In that case, the incoming beam of radiation may for example be split in a first beam of desired radiation that propagates in its original direction and a beam of secondary radiation that is deviated from this direction by a one-dimensional lenticular array. In practice, as shown in the embodiment shown in FIGS. 4 and 6A, 6B, the incident radiation is focused to a point called the intermediate focus or otherwise converging toward a point or region. This may cause problems for EUV radiation transmission through a small aperture if the aspect ratio becomes large. Therefore, it may be desirable to align the direction of the aperture with the incoming radiation. This is illustrated, for example, in FIG. 12A, which schematically illustrates the aperture direction varied as a function of position so as to be substantially aligned with rays of the incoming radiation. Alternatively or additionally, the aperture may be perpendicular to a surface of the spectral purity filter that receives the incoming radiation, but the spectral purity filter is curved, or segmented, to keep the orientation of the aperture close to the direction of the incoming radiation. This is illustrated, for example, in FIG. 12B, which schematically illustrates tilted segments of the spectral purity filter. The spectral purity filter 40 may be formed as a flat plate (FIG. 12A), or as a plurality of flat plates (FIG. 12B) by forming the plates as a GRIN-lens as shown in FIGS. 11A, 11B. FIGS. 11A and 11B schematically depict an operating principle of a GRIN lens. In an embodiment, the spectral purity filter may be formed with a surface relief as shown in one of the FIGS. 7, 8A, 8B, 9A, 9B, 10A, 10B. In an embodiment (illustrated in FIGS. 11A and 11B), the refractive index has a main transition direction in a direction of the plane of the spectral purity filter 40. In an embodiment, the refractive index has a main transition direction that is determined by the local normal of the surface.

It will be appreciated that embodiments of the invention may be used for any type of EUV source, including but not limited to a discharge produced plasma source (DPP source), or a laser produced plasma source (LPP source). However, an embodiment of the invention may be particularly suited to suppress radiation from a laser source, which typically forms part of a laser produced plasma source. This is because such a plasma source often outputs secondary radiation arising from the laser.

The spectral purity filter may be located practically anywhere in the radiation path. In an embodiment, the spectral purity filter is located in a region that receives EUV-containing radiation from the EUV radiation source and delivers the EUV radiation to a suitable downstream EUV optical system, wherein the radiation from the EUV radiation source is arranged to pass through the spectral purity filter prior to entering the optical system. In an embodiment, the spectral purity filter is in the EUV radiation source. In an embodiment, the spectral purity filter is in the EUV lithographic apparatus. In an embodiment, the spectral purity filter is located in a radiation path after the plasma but before the collector.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A spectral purity filter comprising:
   a body; and
   an aperture in the body, wherein the aperture has a cross-dimension larger than a wavelength of an extreme ultraviolet (EUV) radiation but smaller than a wavelength of a non-EUV secondary radiation, wherein the spectral purity filter is configured to allow transmission therethrough of the EUV radiation and to refract and transmit therethrough the non-EUV secondary radiation.

2. The spectral purity filter of claim 1, wherein the body is an optically active body that provides for a transition in an effective refractive index for the non-EUV secondary radiation, the aperture extending in a first direction, the transition having a main transition direction in a direction that deviates from the first direction.

3. The spectral purity filter of claim 1, wherein a surface of the body forms a lens.

4. The spectral purity filter of claim 3, wherein the lens is a Fresnel lens.

5. The spectral purity filter of claim 3, wherein a surface of the body forms a plurality of lenses.

6. The spectral purity filter of claim 1, wherein a pattern of the aperture in the body is varied to form a graded refractive index lens.

7. The spectral purity filter of claim 1, wherein a surface of the body forms a prism.

8. The spectral purity filter of claim 1, wherein a surface of the body forms a structure arranged to reflect the non-EUV secondary radiation.

9. The spectral purity filter of claim 1, wherein a surface of the body is provided with a surface roughness to deflect the non-EUV secondary radiation.

10. The spectral purity filter of claim 1, wherein the aperture is aligned in a direction of propagation of the EUV radiation and non-EUV secondary radiation.

11. The spectral purity filter of claim 10, wherein the body comprises a plurality of tilted segments having the aperture aligned substantially perpendicular to a face of the segment arranged to receive the EUV radiation and the non-EUV secondary radiation.

12. The spectral purity filter of claim 10, wherein the aperture extends at an angle other than perpendicular to a face of the spectral purity filter arranged to receive the EUV radiation and the non-EUV secondary radiation.

13. The spectral purity filter of claim 1, further comprising a second body defining a pin-hole located in a radiation path after the body, the pin-hole arranged to receive transmitted EUV radiation and to block the refracted non-EUV secondary radiation.

14. A source module for use in or with a lithographic apparatus, the source module being constructed to generate extreme ultraviolet (EUV) radiation and to output the EUV radiation and non-EUV secondary radiation, the source module comprising:
a spectral purity filter configured to allow transmission therethrough of the EUV radiation and to refract and transmit therethrough the non-EUV secondary radiation, wherein the spectral purity filter comprises an aperture, and wherein the aperture has a cross-dimension larger than a wavelength of the EUV radiation but smaller than a wavelength of the non-EUV secondary radiation.

15. The source module of claim 14, wherein:
the source module is constructed to converge the generated radiation to an intermediate focus,
the aperture is arranged in a location of an optical path, and receives the generated radiation before the intermediate focus, and
the aperture is aligned in a direction of propagation of the converging generated radiation.

16. A device manufacturing method comprising:
generating radiation comprising extreme ultraviolet (EUV) radiation and non-EUV secondary radiation using a radiation source;
filtering the radiation to allow transmission of the EUV radiation and to refract and transmit therethrough the non-EUV secondary radiation using a spectral purity filter that comprises an aperture, and wherein the aperture has a cross-dimension larger than a wavelength of the EUV radiation but smaller than a wavelength of the non-EUV secondary radiation; and
projecting a patterned beam of the transmitted EUV radiation onto a substrate.

17. A lithographic apparatus comprising:
a source module configured to generate extreme ultraviolet (EUV) radiation and to output the EUV radiation and non-EUV secondary radiation;
a spectral purity filter configured to allow transmission therethrough of the EUV radiation and to refract and transmit therethrough the non-EUV secondary radiation, wherein the spectral purity filter comprises an aperture, and wherein the aperture has a cross-dimension larger than a wavelength of the EUV radiation but smaller than a wavelength of the non-EUV secondary radiation; and
a projection system configured to project a pattern beam of radiation comprising the EUV radiation onto a substrate.

* * * * *

UNITED STATES PATENT AND TRADEMARK OFFICE
CERTIFICATE OF CORRECTION

PATENT NO. : 9,195,144 B2  
APPLICATION NO. : 13/059057  
DATED : November 24, 2015  
INVENTOR(S) : Jak et al.

Page 1 of 1

It is certified that error appears in the above-identified patent and that said Letters Patent is hereby corrected as shown below:

On the title page, item (75), Inventor section, after "Andrei Mikhailovich Yakunin, Eindhoven" please delete "(RU)" and insert --(NL)--.

Signed and Sealed this  
Fifteenth Day of March, 2016

Michelle K. Lee  
*Director of the United States Patent and Trademark Office*